(12) United States Patent
Jimarez et al.

(10) Patent No.: US 6,246,124 B1
(45) Date of Patent: Jun. 12, 2001

(54) ENCAPSULATED CHIP MODULE AND METHOD OF MAKING SAME

(75) Inventors: Miguel A. Jimarez, Newark Valley; Marybeth Perrino, Apalachin; Son K. Tran, Endwell, all of NY (US); Tien Y. Wu, The Morning Side (SG)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/154,618

(22) Filed: Sep. 16, 1998

(51) Int. Cl.[7] .......................... H01L 23/29; H01L 23/48; H01L 23/52; H01L 21/44; H01L 21/48
(52) U.S. Cl. .................. 257/790; 257/772; 257/787; 257/778; 257/779; 438/108; 438/126
(58) Field of Search .................. 257/790, 772, 257/787, 738, 778, 779; 438/107, 108, 126, 127, 613; 29/841, 855

(56) References Cited

U.S. PATENT DOCUMENTS

| | | | |
|---|---|---|---|
| 4,625,227 | 11/1986 | Hara et al. | 257/787 |
| 5,136,366 * | 8/1992 | Worp et al. | 257/787 |
| 5,229,642 | 7/1993 | Hara et al. | 257/787 |
| 5,256,903 | 10/1993 | Obata et al. | 257/796 |
| 5,336,931 | 8/1994 | Juskey et al. | 257/778 |
| 5,440,169 | 8/1995 | Tomita et al. | 257/796 |
| 5,535,101 * | 7/1996 | Miles et al. | 257/787 |
| 5,539,257 | 7/1996 | Hara et al. | 257/787 |
| 5,552,639 | 9/1996 | Hara et al. | 257/787 |
| 5,583,381 | 12/1996 | Hara et al. | 257/787 |
| 5,763,295 * | 6/1998 | Tokuno et al. | 438/108 |
| 5,869,886 * | 2/1999 | Tokuno | 257/778 |
| 5,981,314 * | 11/1999 | Glenn et al. | 438/127 |

FOREIGN PATENT DOCUMENTS

| | | | |
|---|---|---|---|
| 62-92345 * | 4/1987 | (JP) | 257/790 |
| 62-241358 * | 10/1987 | (JP) | 257/790 |
| 1-152750 * | 6/1989 | (JP) | 257/790 |

OTHER PUBLICATIONS

R. A. Christiansen and L. R. Steward, Semiconductor Die Encapsulant with Intrinsic Release Layer, IBM Technical Disclosure Bulletin, Vo. 34, No. 2, pp. 181–182 (Jul.–1991).

* cited by examiner

*Primary Examiner*—Olik Chaudhuri
*Assistant Examiner*—Shrinivas H. Rao
(74) *Attorney, Agent, or Firm*—Ratner & Prestia

(57) ABSTRACT

An encapsulated semiconductor chip module. The chip module has the overlying encapsulant adhered directly and integrally to bare portions of the substrate to which the chip is mounted. This configuration enhances the adhesion and inhibits unintended delamination of the encapsulant from the balance of the module. The module is made by patterning anchor openings into the solder mask. The anchor openings expose corresponding portions of the substrate. It is important to locate the anchor openings over parts of the substrate that do not have circuitry on them, that is, on bare portions, so as to avoid corrosion or contamination of the circuit connections.

10 Claims, 3 Drawing Sheets

ENCAPSULATED CHIP MODULE AND METHOD OF MAKING SAME

TECHNICAL FIELD

The present invention relates generally to semiconductor chip packages and, more particularly, to overmold or "glob-top" semiconductor chip carriers and to a related method of manufacturing such chip carriers.

BACKGROUND OF INVENTION

It is frequently desirable to encapsulate electronic devices, such as semiconductor dies, mounted on the surface of a substrate. Such semiconductor dies are electrically coupled to circuitry on the substrate, such as by wire bonding or by solder bumps. Encapsulation serves a variety of purposes.

One of the main purposes of encapsulation is to shield the encapsulated component from the environment and the contaminants of the environment. Encapsulation generally is accomplished by depositing a flowable dielectric material, such as an epoxy resin, on top of the electronic component and substrate to be encapsulated. One technique is to form an "overmold" by transfer molding. Transfer molding involves the use of dielectric material in the form of thermoset plastic which is injected at relatively high temperatures and under high pressures into a metal die cavity.

A related method, known as "flow forming" or "glob-top packaging," also uses a thermoset plastic, dielectric, epoxy material. The process generally requires lower temperatures than transfer molding. Flow forming uses the lower viscosity of the flowable material and a dam around the periphery of the area to be encapsulated. The dam constrains the lateral flow of the dielectric material to the desired region to be encapsulated.

Unfortunately, certain semiconductor package configurations are prone to having the overlying glob-top or overmold encapsulant separate or "delaminate" from its position encapsulating the semiconductor die. Such separation or delamination exposes the semiconductor die to the environment and thus defeats one of the main purposes of encapsulation, that is, isolating the semiconductor die. This delamination problem is often aggravated when the underlying substrate carrying the encapsulant is non-rigid or flexible, because such flexibility often reduces the strength of adhesive bonding between the substrate and the encapsulant. The industry tendency towards miniaturization and ever larger semiconductor dies also tends to reduce the available surface area to which the encapsulant can bond, another factor which increases the likelihood of separation or delamination.

Attempts to counteract the delamination problem have had mixed results at best. For example, one approach, disclosed in U.S. Pat. No. 5,336,931 issued to Juskey, requires the additional processing step of drilling holes through the substrate at multiple, selected locations, and allowing the encapsulant material to flow into such holes. Among the drawbacks to this approach is the need to place such holes in "unused real estate" of the substrate and in a way that does not interfere with subsequent wire bonding steps. Furthermore, the addition of such holes may also tend to weaken the substrate and concentrate stresses, a drawback which becomes all the more significant when dealing with thinner or more structurally fragile substrates.

The unavailability of locations to drill such holes and the concern for the structural integrity of the substrate may also limit the size that such holes can attain, as well as the amount of dielectric material that the holes can receive. A limitation on the amount of dielectric material received in the holes limits, in turn, the additional adhesive strength imparted to the bond between the encapsulant and the substrate.

Another attempt to address the delamination tendency has been to add plasma treatment operations to the solder mask. Such operations "roughen" the surface of the solder mask against which the encapsulant adheres. The rougher surface makes it easier for the encapsulant to remain bonded. Even with this process improvement, however, an unacceptably high percentage of glob-top modules are rejected for delamination problems.

Therefore, a need remains to enhance the adhesion of overmold or glob-top encapsulant to its underlying substrate. There is a further need to enhance such adhesion without increasing the cost of manufacturing semiconductor chip carriers. A still further need, unmet in the prior art, is to enhance the adhesion of overmold or glob-top encapsulant to its underlying substrate without adding significant manufacturing steps.

SUMMARY OF THE INVENTION

To meet these and other needs, and in view of its purposes, the present invention, in one aspect, provides a semiconductor chip module. The chip module has an overmold or glob-top encapsulant adhered to one of its surfaces. The chip module includes a substrate which has a first, substantially planar surface. The planar surface of the substrate includes circuitized areas and bare areas without circuits on the bare areas. The semiconductor chip is positioned on the substrate and electrically coupled to the substrate.

A first dielectric layer is interposed between the first surface of the substrate and the chip. A second dielectric layer covers the chip to form the overmold or glob-top encapsulant. The semiconductor chip module is structured so that the encapsulating, second dielectric layer can be bonded integrally and directly to the first surface of the substrate. Such bonding enhances the adhesion of the second dielectric layer to the substrate.

In accordance with another aspect of the present invention, the semiconductor chip module has at least one anchor opening defined in portions of the first dielectric layer and located to expose a corresponding, substantially planar bare area of the substrate. The second dielectric layer is bonded to the substrate in part by having some of the dielectric material flowably received into the anchor opening, deposited on the corresponding bare area, and adhered to such area.

In accordance with another aspect of the present invention, the first dielectric layer is composed of a solder mask, and the second dielectric layer comprises a thermoset plastic material. The anchor openings in the solder mask are located at least about 0.010 to about 0.020 inches from the perimeter of the dielectric layer deposited on the substrate.

A method according to the present invention includes the steps of applying the first dielectric layer to preselected areas of the surface of a circuitized substrate but not to other areas of such surface. In this way, anchor openings are formed in the first dielectric layer and corresponding areas of the substrate are exposed by such anchor openings. The electronic component is positioned on the circuitized substrate and electrically coupled to the substrate. Thereafter, a second dielectric layer is applied to the electronic component, to the first dielectric layer, and to the exposed areas of the substrate which span the anchor openings of the first dielectric layer. The second dielectric layer flows into the anchor openings to form an integral chip cover which extends between the chip surface and the exposed areas of the circuitized substrate.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 3b is a cross-sectional view of the substrate and dielectric layer of FIG. 3a taken along line 3b—3b of FIG. 3a.

DETAILED DESCRIPTION OF THE PREFERRED EMBODIMENTS

Figure 1:
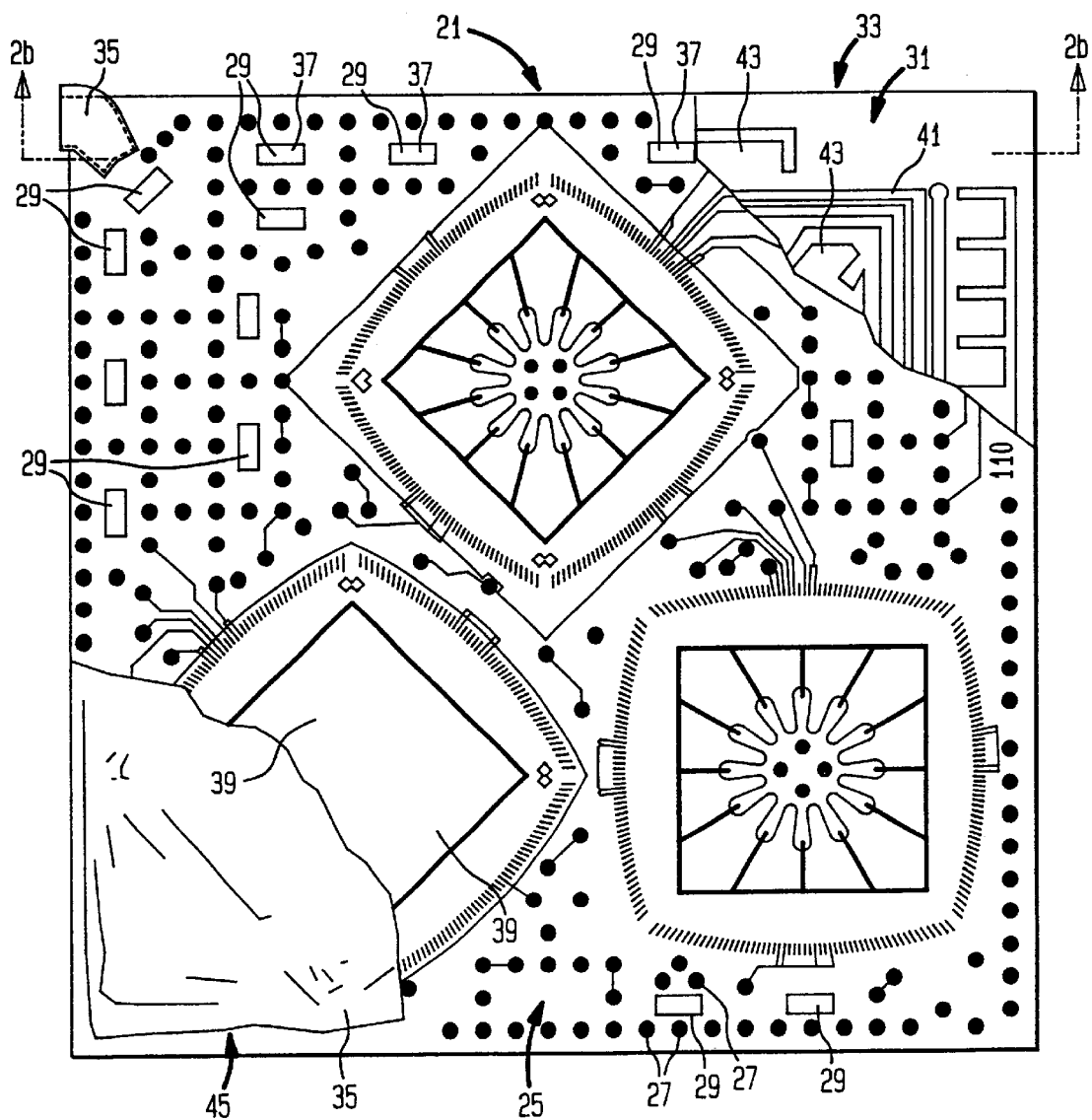
FIG. 1 is a top plan view of an overmold (or glob-top) semiconductor chip module according to the present invention, with substantial portions cut away to reveal the dielectric layer patterned with anchor openings in accordance with the present invention.
Figure 2A:
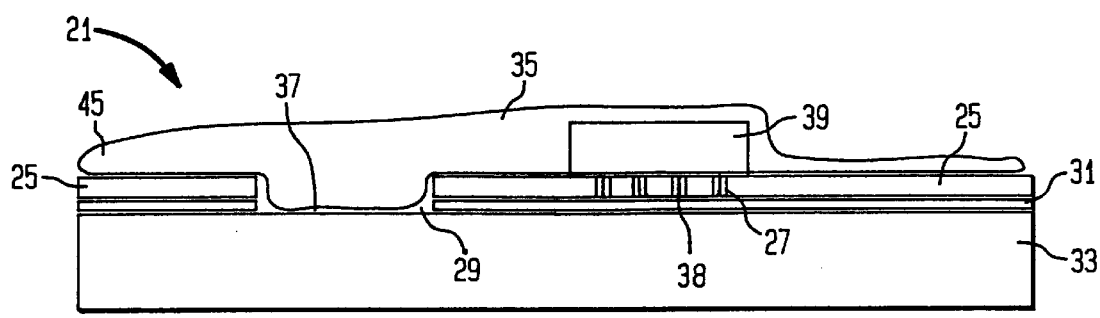
FIG. 2a is a partly schematic, cross-sectional view of the semiconductor chip module of FIG. 1.
Figure 2B:
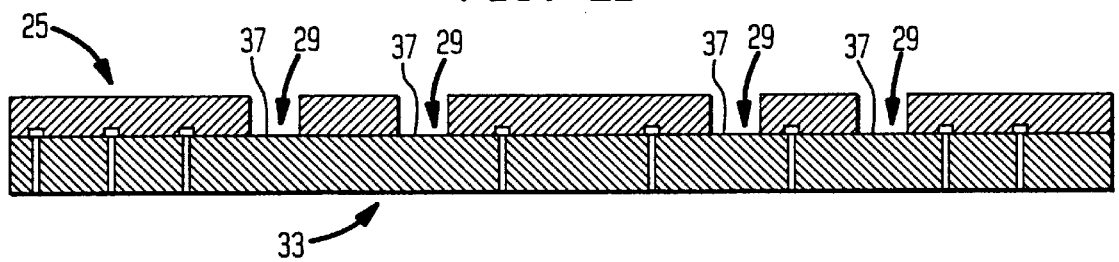
FIG. 2b is a cross-sectional view of the substrate and dielectric layer of FIG. 1 taken along line 2b—2b of FIG. 1.

Referring now to the drawing in general, and to FIGS. 1, 2a, and 2b in particular, a first layer of dielectric material is shown in the form of a solder mask 25 of photoresist or photoimageable material. The solder mask 25 is disposed on the circuitized surface 31 of an underlying substrate 33. A chip 39 is mounted and electrically coupled to the substrate 33. An encapsulating, second layer of dielectric material is transfer molded or flow-formed onto the chip 39 and substrate 33 to form an encapsulant or overmold 35 for protecting the chip 39.

Significantly, the solder mask 25 is not only patterned with the usual array of electrical interconnect holes 27, but also includes additional anchor openings 29 at strategically placed locations as discussed in more detail below. These anchor openings 29 increase the adhesion of encapsulant 35 to the substrate 33 by allowing the encapsulant 35 to flow into the anchor openings 29 and bond to corresponding exposed portions 37 of the substrate 33 which are exposed by the anchor openings 29. The result is an overmold or glob-top chip module 21 having increased adhesion of the encapsulant 35 to the substrate 33, thereby reducing the undesirable tendency of encapsulant 35 to separate or delaminate from the substrate 33.

Circuitized surface 31 of substrate 33 has been patterned with circuit areas 41 and substantially planar, bare areas 43 on which there are no circuits patterned. It is important to define anchor openings 29 in solder mask 25 at locations corresponding to bare areas 43, where there is no circuitry. Otherwise, the anchor openings 29 and the encapsulating material deposited in the anchor openings 29 could cause corrosion or contamination of the circuitry and adversely affect the performance of the chip module 21.

Accordingly, each anchor opening 29 is sized to expose at least partially a corresponding one of the bare areas 43. As such, when encapsulant 35 is applied to chip module 21, encapsulant 35 flows into anchor openings 29 to be deposited on and adhered to bare areas 43. Thus, encapsulant 35 is bonded both to the solder mask 25 and directly and integrally bonded to the substrate 33, thereby enhancing its adhesion to the substrate 33 and reducing the risk of delamination.

The anchor openings 29 not only must be placed to avoid exposing the circuit areas 41, but anchor openings 29 are preferably located a predetermined distance from the outer perimeter 45 of encapsulant or overmold 35. If the anchor openings 29 are placed too close to outer perimeter 45, such placement has been found to aggravate the lamination problems discussed above. A spacing of no less than about 0.010 to 0.020 inches from outer perimeter 45 has been found suitable.

Chip module 21 in this embodiment includes multiple semiconductor chips 39 mounted at discrete locations on substrate 33. Only one of the semiconductor chips 39 is shown in the drawing. The second dielectric layer forming encapsulant 35 covers the multiple chips 39 integrally.

Semiconductor chips 39 are electrically coupled to the circuitry of circuitized surface 31 of substrate 33 by any suitable mechanism known in the art. In the illustrated case, a wire-bonded mechanism is applied. The wiring 38 extends from suitable locations on the chips 39, through selected ones of interconnect holes 27, and to solder pads (not shown) of the circuit areas 41 of substrate 33.

Anchor openings 29 in solder mask 25 and corresponding exposed portions 37 on substrate 33 are generally rectangular in shape in this embodiment, but such shape is exemplary only. Alternate shapes are equally suitable, and the size, number, and locations of the anchor openings 29 depend on the arrangement and density of the circuits patterned on circuitized surface 31. Whatever shapes are used for anchor openings 29, however, the areas defined by such anchor openings are preferably sufficiently large to have the dielectric material of encapsulant 35 flow readily into them and form a good adhesive bond with corresponding exposed portions 37 after suitable curing has occurred.

In one preferred embodiment, anchor openings 29 are rectangles ranging in size from about 0.010 by 0.015 inches to about 0.010 by 0.040 inches spaced at multiple locations inwardly from perimeter 45 by about 0.010 to about 0.020 inches. The exact geometry of the anchor openings 29 is not significant, and additional anchor openings may be patterned to correspond to additional bare areas 43 on the substrate 33.

The substrate 33 can be any carrier suitable for the particular application, including by way of example a laminate, resin-based card or a printed circuit board. The first dielectric layer (solder mask 25) is preferably a dry-film solder mask, such as one sold under the commercial designation VACREL 8130. Other dielectric materials are also suitable, however, so long as they can be patterned to include anchor openings 29 in them as discussed above. The second dielectric layer for forming encapsulant 35 may be thermoset plastic which is either transfer molded or flow formed. Suitable overmold material is sold under the commercial designation XKE by Toshiba.

The construction of the overmold chip module 21 according to the present invention is apparent from the foregoing discussion. The substrate is suitably patterned with circuit areas 41 and bare areas 43 on which there are no circuits. A first dielectric layer in the form of solder mask 25 is attached to the metalized, circuitized surface 31 of substrate 33. Portions of the solder mask 25 are selectively removed to form apertures used as connections, such as interconnect holes 27, and to form apertures corresponding to the anchor openings 29, which are used to enhance the adhesion of the encapsulant 35 to substrate 33. Solder mask 25 is made, in one preferred embodiment, of photoimageable material which is selectively subjected to suitable radiation and then rinsed to remove the unwanted portions of the material.

The anchor openings 29 are located to reveal or expose corresponding exposed portions 37 of substrate 33. These exposed portions 37 of substrate 33 correspond, in turn, to substantially planar, bare areas 43 of substrate 33, on which there is no circuitry. Semiconductor chip 39, or another suitable electronic component, is positioned on circuitized surface 31 and electrically coupled to the circuitry defined on such surface.

An amount of dielectric, flow-formed material sufficient to form encapsulant or overmold 35 is dispensed, generally as a liquid, onto the upper surface of the semiconductor chip 39 and onto the solder mask 25. The material flows into anchor openings 29 and is deposited against corresponding exposed portions 37 on substrate 33. The resulting, second layer of dielectric material is cured at a suitable temperature to harden the material into encapsulant 35 and bond it to the balance of the chip module 21. This process forms a direct and integral bond between the bare areas 43 of substrate 33 and the encapsulant 35.

Figure 3A:
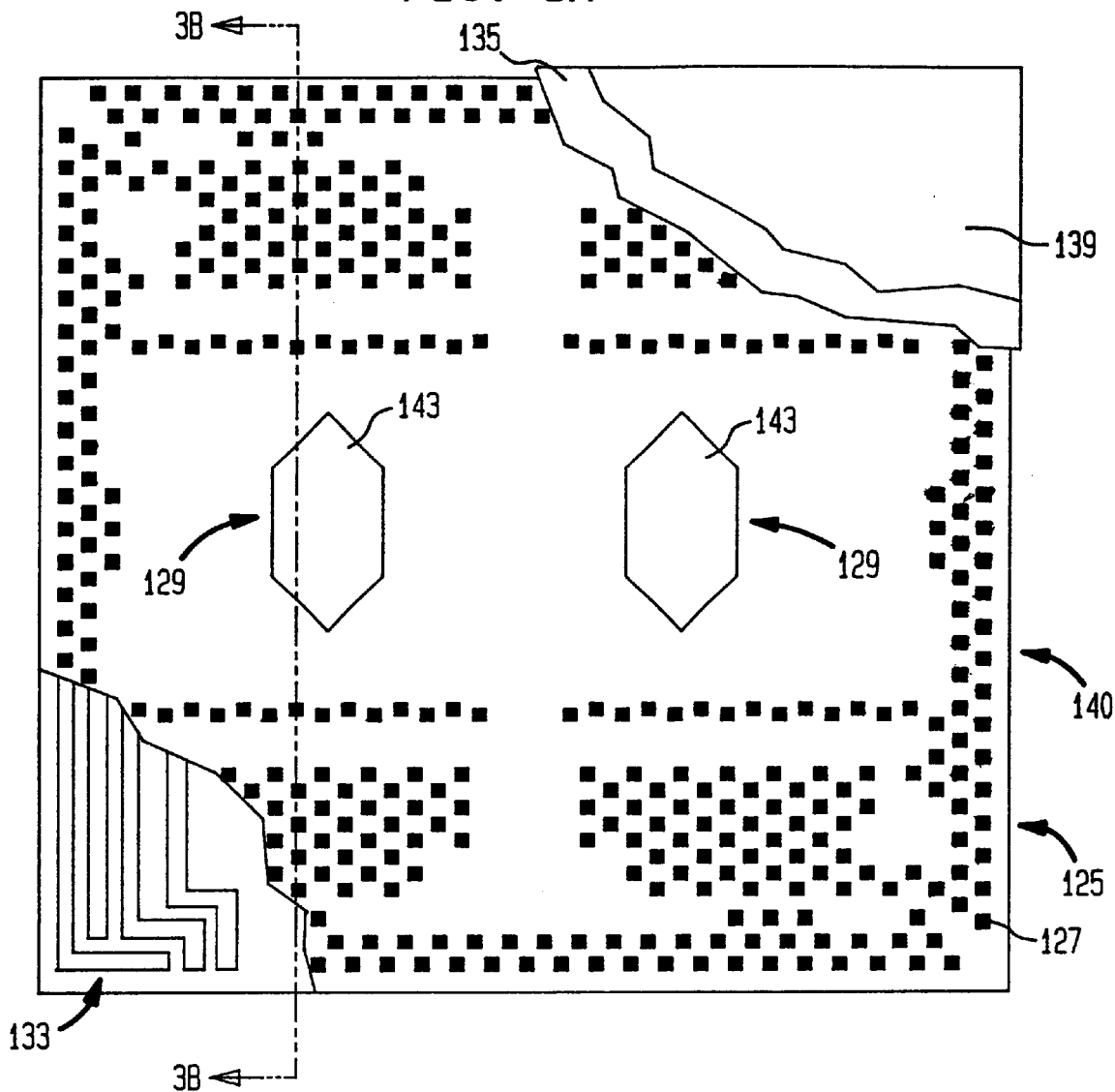
FIG. 3a is a top plan view of an alternative embodiment of the present invention suitable for a "flip-chip"-type semiconductor module.
Figure 3B:
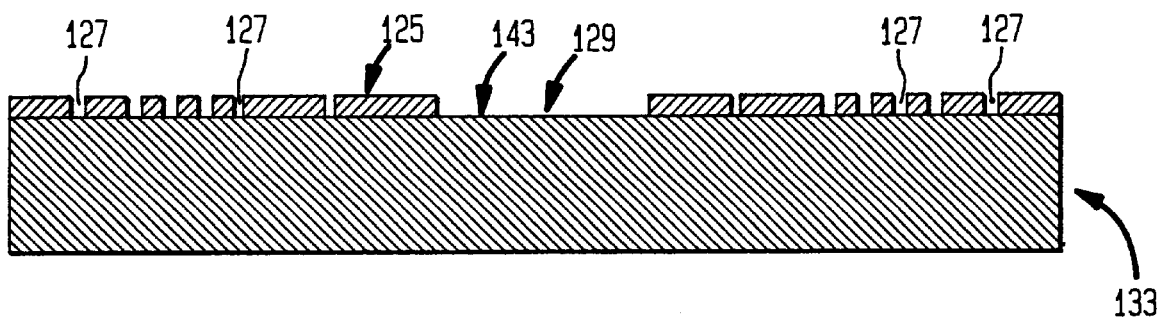

The foregoing chip module and related method of manufacturing the chip module are also suitable for semiconductor chips mounted with solder bumps, referred to as "flip chips" by those skilled in the art. Solder mask 125 for such a flip chip embodiment is shown in FIGS. 3a and 3b. In the case of a flip chip 139, the desired adhesion of the encapsulant is preferably enhanced under the chip footprint. Accordingly, as shown in FIGS. 3a and 3b, the solder mask 125 has anchor openings 129 patterned in solder mask 125 and corresponding to locations within footprint 140 of the flip chip 139 to be adhered to the solder mask 125.

In the case of a flip chip application such as the embodiment illustrated in FIGS. 3a and 3b, the dielectric material which forms the encapsulant 135 comprises chip underfill, such as the material marketed under the commercial designation Hysol FP4511. The underfill encapsulant 135 flows into anchor openings 129 in a manner similar to that discussed above with reference to the previous embodiment, and is deposited on and bonds to bare areas 143 of the underlying substrate 133.

Test data reveal that the addition of anchor openings 29, 129 and the resulting direct and integral bond between corresponding bare areas 43, 143 and encapsulant 35, 135 greatly enhances the adhesion of encapsulant 35, 135 to the balance of chip module 21. In particular, the adhesion of the encapsulant 35, 135 is increased by about one and one-half to seven times over conventional adhesion techniques. The exact increase in adhesion depends on the sizes and locations of bare areas 43, 143 available to receive encapsulant 35, 135, as well as the dimensions of the substrate 33, 133; the chip 39, 139; and the circuit areas 41.

Test results are summarized in Tables 1 and 2 below:

TABLE 1

ADHESION OF ENCAPSULANT

| | INTERFACE | FRACTURE TOUGHNESS $K_{ic}$ in psi $(in)^{1/2}$ |
|---|---|---|
| 1. | Unpatterned soldermask A | 904 +/− 179 |
| 2. | Patterned soldermask B on laminate | 619 +/− 381 |
| 3 | Patterned soldermask B on metal | 222 +/− 159 |
| 4. | Soldermask patterned with anchor openings | 1420 +/− 120 |

TABLE 2

ADHESION OF UNDERFILL

| | INTERFACE | FRACTURE TOUGHNESS $K_{ic}$ in psi $(in)^{1/2}$ |
|---|---|---|
| 1. | Unpatterned soldermask on laminate card | 300 |
| 2. | Soldermask with C4 patterning | 800 |
| 3. | Soldermask with anchors | 1950 |

Table 1 summarizes measurements of the fracture toughness of the critical interface $K_{ic}$ between the encapsulant and different surfaces numbered 1–4. Surfaces 1–3 are prior art soldermasks, whereas surface 4 (the "soldermask patterned with anchor openings") is a soldermask 25 with anchor openings 29 patterned in it according to the present invention. The increased adhesion of the encapsulant to the chip module 21 is expressed in terms of the fracture toughness of the critical interface $K_{ic}$ and is 1420+/−120 psi(in)½, a significant improvement over the corresponding adhesions for surfaces 1–3.

Table 2 summarizes measurements of the fracture toughness of the critical interface $K_{ic}$ between chip underfill and the underlying carrier in various "flip-chip" applications numbered 1–3. Applications 1 and 2 are prior art structures, whereas application 3 ("soldermask with anchors") is an embodiment of soldermask 125 with anchor openings 129 patterned in it. Again, the increased adhesion of the invention is expressed as a fracture toughness of 1950 psi(in)½.

In addition to the advantages apparent from the foregoing description, the chip module 21 according to the present invention is enhanced without needing significant modifications to current manufacturing processes. Additional anchor openings 29, 129 are formed in the solder mask of the module at the same time as interconnect holes and other geometric shapes are patterned in the solder mask. As a further advantage, the adhesion of encapsulant 35, 135 is improved without adding structures or costs to the resulting chip module 21. As a still further advantage, there is no need to drill holes into the substrate 33, 133 or otherwise compromise the structural integrity of the substrate in order to benefit from the advantages of the present invention.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A semiconductor chip module comprising:

a substrate having a substantially planar surface;

a pattern of circuit areas disposed on the surface of the substrate;

non-conductive bare areas adjacent the circuit areas, the bare areas being substantially planar and further being substantially coplanar to the surface of the substrate;

a semiconductor chip positioned on the substrate and electrically coupled thereto;

a first dielectric layer disposed on the surface of the substrate between the substrate and the chip and having at least one anchor opening located to at least partially expose a corresponding one of the bare areas;

a second dielectric layer covering the chip and forming an outer perimeter with the at least one anchor opening spaced inwardly from the perimeter;

the dielectric material of the second layer having flowed into the at least one anchor opening to be deposited on and adhered to the corresponding one of the bare areas, thereby bonding the second dielectric layer directly and integrally to at least one of the bare areas to enhance the adhesion of the second dielectric layer.

2. The module of claim 1, further comprising a plurality of the anchor openings and a corresponding plurality of the bare areas.

3. The module of claim 2, wherein the anchor openings are spaced at least about 0.010 inches from the perimeter.

4. The module of claim 1, wherein the first dielectric layer comprises a solder mask.

5. The module of claim 1, wherein the second dielectric layer comprises a thermoset plastic material.

6. The module of claim 1, wherein the substrate is selected from the group consisting of a laminate card and a printed circuit board.

7. The module of claim 1, wherein the semiconductor chip is electrically bonded to the substrate.

8. The module of claim 1, further comprising a plurality of the semiconductor chips mounted at discrete locations on the substrate, and wherein the second dielectric layer covers the plurality of the semiconductor chips.

9. The module of claim 1, further comprising a plurality of interconnect holes defined in the first dielectric layer at locations corresponding to the circuit areas of the underlying substrate, the semiconductor chip being electrically coupled to the substrate through at least some of the interconnect holes.

10. A semiconductor chip module comprising:

a substrate having a substantially planar surface;

a pattern of circuit areas disposed on the surface of the substrate;

non-conductive bare areas adjacent the circuit areas, the bare areas being substantially planar and further being substantially coplanar to the surface of the substrate;

a semiconductor chip positioned on the substrate and electrically coupled thereto by solder bumps;

a dielectric layer disposed between the chip and the substrate and having at least one anchor opening located to at least partially expose a corresponding one of the bare areas;

underfill disposed between the chip and the dielectric layer and forming an outer perimeter with the at least one anchor opening spaced inwardly from the perimeter;

the underfill having flowed into the at least one anchor opening to be deposited on and adhered to the corresponding one of the bare areas, thereby bonding the underfill directly and integrally to at least one of the bare areas to enhance the adhesion of the underfill.

* * * * *

UNITED STATES PATENT AND TRADEMARK OFFICE
CERTIFICATE OF CORRECTION

PATENT NO. : 6,246,124 B1
DATED : June 12, 2001
INVENTOR(S) : Miguel A. Jimarz et al.

Page 1 of 1

It is certified that error appears in the above-identified patent and that said Letters Patent is hereby corrected as shown below:

<u>Title page,</u>
Item [54], delete "ENCAPSULATED CHIP MODULE AND METHOD OF MAKING SAME" insert -- ENCAPSULATED SEMICONDUCTOR MODULE --

Signed and Sealed this

Second Day of April, 2002

*Attest:*

JAMES E. ROGAN
*Attesting Officer*     *Director of the United States Patent and Trademark Office*